US008638619B2

(12) United States Patent
Sutardja

(10) Patent No.: US 8,638,619 B2
(45) Date of Patent: Jan. 28, 2014

(54) HIGH SPEED INTERFACE FOR MULTI-LEVEL MEMORY

(71) Applicant: Marvell World Trade Ltd., St. Michael (BB)

(72) Inventor: Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/872,729

(22) Filed: Apr. 29, 2013

(65) Prior Publication Data

US 2013/0235638 A1  Sep. 12, 2013

Related U.S. Application Data

(60) Continuation of application No. 13/179,827, filed on Jul. 11, 2011, now Pat. No. 8,432,753, which is a division of application No. 11/966,009, filed on Dec. 28, 2007, now Pat. No. 7,978,541.

(60) Provisional application No. 60/883,150, filed on Jan. 2, 2007.

(51) Int. Cl.
*G11C 7/00* (2006.01)
*G11C 7/22* (2006.01)

(52) U.S. Cl.
USPC ............ 365/189.16; 365/189.08; 365/185.03; 365/198

(58) Field of Classification Search
USPC ................... 365/189.16, 189.08, 185.03, 198
See application file for complete search history.

(56) References Cited

U.S. PATENT DOCUMENTS

| 5,745,414 | A | 4/1998 | Engh et al. |
| 5,801,980 | A | 9/1998 | Wong et al. |
| 5,901,152 | A | 5/1999 | Tanaka et al. |
| 6,016,472 | A | 1/2000 | Ali |
| 6,515,917 | B2 | 2/2003 | Lamb et al. |
| 6,570,944 | B2 | 5/2003 | Best et al. |
| 6,606,262 | B2 | 8/2003 | Perner |
| 6,721,212 | B2 * | 4/2004 | Sasaki ...................... 365/189.11 |
| 7,177,195 | B2 | 2/2007 | Gonzalez et al. |
| 7,289,378 | B2 | 10/2007 | Ivanov |

(Continued)

FOREIGN PATENT DOCUMENTS

| EP | 1 496 519 A2 | 1/2005 |
| WO | WO-90/12400 A1 | 10/1990 |
| WO | WO-93/22770 A1 | 11/1993 |
| WO | WO-2004/114319 A2 | 12/2004 |

OTHER PUBLICATIONS

4-Megabit 5-volt Only Serial DataFlash AT45D041; Jun. 1997; ATMEL XP002496245.

(Continued)

*Primary Examiner* — Toan Le

(57) ABSTRACT

A memory chip includes a plurality of storage elements. A method of controlling the memory chip includes receiving a plurality of target values from a memory controller. Each target value of the plurality of target values received from the memory controller corresponds to a respective one of the plurality of storage elements. The method further includes, for each storage element of the plurality of storage elements, adjusting a measurable parameter of the storage element until the measurable parameter of the storage element reaches the target value corresponding to the storage element received from the memory controller.

21 Claims, 11 Drawing Sheets

(56) References Cited

U.S. PATENT DOCUMENTS

| | | |
|---|---|---|
| 7,336,531 B2 | 2/2008 | Roohparvar |
| 2005/0219919 A1 | 10/2005 | Ivanov |
| 2005/0286297 A1 | 12/2005 | Roohparvar |

OTHER PUBLICATIONS

International Search Report and Written Opinion for corresponding International Application No. PCT/US2007/026387 mailed Oct. 16, 2008, 29 pages.

* cited by examiner

HIGH SPEED INTERFACE FOR MULTI-LEVEL MEMORY

CROSS-REFERENCE TO RELATED APPLICATIONS

This is a continuation of U.S. patent application Ser. No. 13/179,827, filed on Jul. 11, 2011, which is a divisional application of U.S. patent application Ser. No. 11/966,009 (now U.S. Pat. No. 7,978,541), filed on Dec. 28, 2007, which claims the benefit of U.S. Provisional Application No. 60/883,150, filed on Jan. 2, 2007. The entire disclosures of the above applications are incorporated herein by reference.

FIELD

The present disclosure relates to nonvolatile memory and more particularly to interfaces for multi-level nonvolatile memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The density of solid-state memory devices is increasing as more bits of user data can be stored into each solid-state storage element. For example, flash memory devices may store two bits per storage element by varying the stored charge in the storage element to one of four ($2^2$) levels in order to produce one of four threshold voltages. Currently, storing even more bits (such as three or four) per storage element is being investigated.

Other solid-state storage elements, such as those used in phase-change memory (PCM) devices, may store data as varying levels of resistance. Regardless of the storage mechanism, optimum spacing of the different levels may take into account the uncertainty of writing and/or reading each level. For example, within the range of achievable levels, two or more predefined levels may be established. The term level may include a voltage, a current, a resistance, or any other suitable storage parameter. The range of achievable levels is defined by a lower limit and an upper limit, which may be governed by process parameters. To write data, the storage element is programmed to one of the predefined levels. To read data, the level of the storage element is compared to the predefined levels.

There may be variability or uncertainty in reading or writing the level of a storage element. For example, when writing a first predefined level, the actual level achieved may be slightly above or below the first predefined level. This may be the result of, for example, programming the storage element using an open-loop process that is not calibrated perfectly. Alternatively, even if a closed-loop process is used, the first predefined level may be overshot or undershot. For example, this may occur when, during the last programming iteration, the programming granularity is greater than the difference between the current level and the first predefined level.

In addition, even if the first predefined level is written precisely, the level read may not be exactly equal to the first predefined level. For example, the level of the storage element may decay or shift with time. In addition, noise, crosstalk, and/or uncertainty in the reading process may lead to a slightly different level being read. A probability density function may be defined that represents the likelihood of a certain level being read a predetermined time after a predefined level is written.

FIG. 1 is a graphical representation of exemplary probability density functions (pdfs) for a four-predefined-level write scheme. In this example, the four predefined levels, L0, L1, L2, and L3, have corresponding pdfs with approximately the same shape. For example, when predefined level L0 is written, FIG. 1 indicates that the actual level achieved is most likely L0. However, it is only slightly less likely that the level achieved is slightly above or below L0. The probability of a resulting level decreases as it gets further from L0.

It may be desirable to space the predefined levels so that each pdf ends (drops to zero) before the next pdf begins, as shown in FIG. 1. For example, this may ensure that a level on the high side of the level L1 pdf is not misinterpreted as a level on the low side of the level L2 pdf. The predefined levels L0, L1, L2, and L3 may therefore be arranged so that their pdfs do not overlap. When the pdfs for various levels are approximately the same, the predefined levels may be uniformly spaced to achieve this goal.

FIG. 2 depicts exemplary pdfs for a four-predefined-level write scheme when the pdfs differ. For example, in FIG. 2, the L0 pdf is wider (has a greater standard deviation) than that of L1, L2, and L3. There are various reasons why pdfs may be different for different levels. For example, L0 may be an erased level, which cannot be controlled as accurately as programmed levels. Other process variability or design considerations may affect the size and shape of the pdfs.

To accommodate the widened level L0 pdf, predefined levels L1 and L2 may be moved slightly higher and closer to each other, as shown in the example of FIG. 2. As more levels are introduced, the proximity of the pdfs may increase, and it may not be possible to avoid overlap between the pdfs. Error control coding may be used, which may identify and/or correct errors resulting from misreading of a previously written level.

Referring now to FIG. 3, a functional block diagram of a memory system according to the prior art is presented. A memory controller 100 interfaces with a memory chip 102. For a write, the memory controller 100 sends user data to the memory chip 102 along with an address to which the user data should be written. The memory controller 100 may also indicate to the memory chip 102 that a write is desired using a read/write signal. The memory chip 102 converts the user data into predefined levels for each storage element that will be written. The memory chip 102 then writes the predefined levels to the storage elements at the designated address.

During a read, the memory controller 100 requests a read from the memory chip 102 and provides an address. The memory chip 102 measures the levels of the storage elements at the given address. These levels are matched up with the closest predefined levels, which are then mapped back to user data. The user data is returned to the memory controller 100. For example, with reference to FIG. 2, if a threshold voltage slightly above predefined level L3 is measured from a charge storage cell, the memory chip 102 decides that predefined level L3 had previously been written.

Predefined level L3 may correspond to a bit pattern of 11, which the memory chip 102 then returns to the memory controller 100. The values of the predefined levels and data/level mappings are determined at design time and hard coded into the memory chip 102. The memory controller 100 does not need to be aware of any level information, simply transmitting binary user data to the memory chip 102 and receiving binary user data from the memory chip 102.

SUMMARY

In general, in one aspect, this specification describes a memory chip including a plurality of storage elements, a receiver and a program module. Each of the storage elements has a measurable parameter. The receiver receives N target values from a memory controller, where N is an integer greater than zero. The programming module adjusts corresponding measurable parameters of N storage elements of the plurality of storage elements to the N target values.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
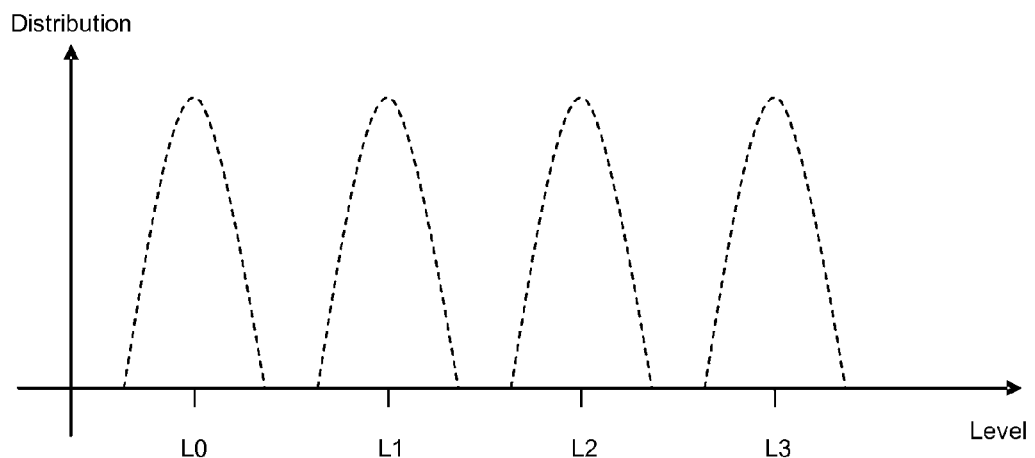
FIG. 1 is a graphical representation of exemplary probability density functions (pdfs) for a four-predefined-level write scheme.
Figure 2:
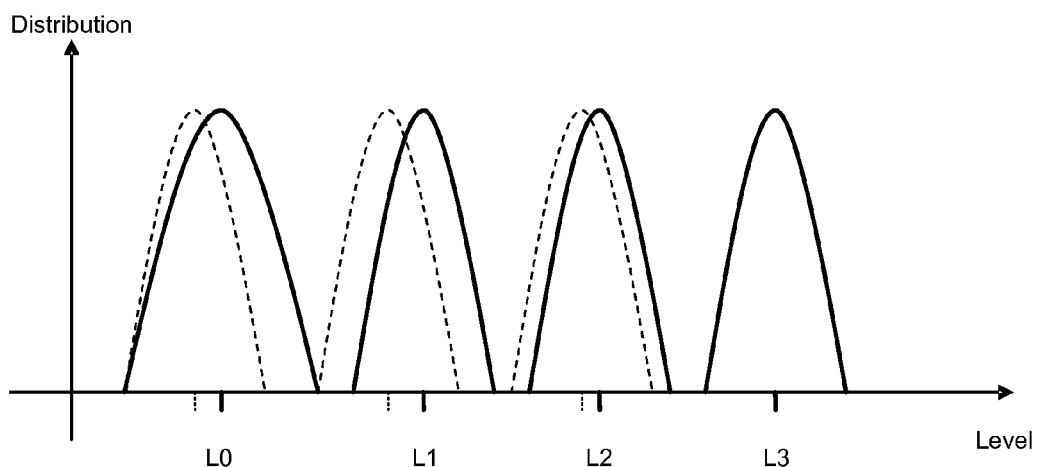
FIG. 2 is a graphical representation of exemplary pdfs for a four-predefined-level write scheme when the pdfs differ.
Figure 3:
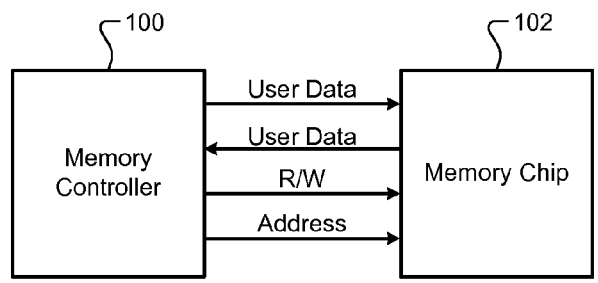
FIG. 3 is a functional block diagram of a memory system according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

The prior art describes predefined levels for storage elements that are set at design time. Newer and emerging multi-level memory technologies may have level probability density functions (pdfs) and optimum level choices that are not fully characterized at design time. For example, characteristics that influence level determinations may vary across manufacturing lots, from wafer to wafer, or even across a single wafer. In addition, these characteristics may change with time and with the number of program or erase cycles that a storage element sustains.

Determining these characteristics may be accomplished using intelligent firmware, mapping tables, and/or digital signal processing. These characteristics may relate to the pdf of what level is read when a defined level will be written. When a defined level is likely to be misread, it may need to be spaced further away from other defined levels. For example, for a storage element that stores 2 bits, 4 defined levels may be defined, where one defined level is spaced further away from the other three defined levels. As the memory chip wears, fewer defined levels may be used and/or spacing between the levels may be increased. In addition, the defined levels may be determined and implemented differently across different areas of a memory chip.

Instead of replicating the capability to determine and use defined levels in each memory chip, a single memory controller may perform some or all of these functions. By locating level control in the memory controller, multiple memory chips do not each have to have this functionality. In addition, fabricating structures for level control, such as mixed signal and/or digital signal processing structures, in the memory chips may require more complex fabrication processes. Moving level control circuitry to the memory controller may decrease the types of devices that need to be fabricated in the memory chip. When memory chips primarily include storage elements, process steps required for other devices may be eliminated, thereby decreasing the cost of memory chips.

In addition, a memory controller may include storage for firmware and an interface for updating the firmware. Replicating this firmware in each memory chip may increase the cost over a single memory controller including the firmware storage. In addition, adding a firmware interface to each memory chip may add increased cost to the memory chip and/or to the cost of the printed circuit board on which the memory chip is located and may introduce signal integrity problems.

In the prior art, a memory controller provides user data to the memory chip, which then translates the user data into predefined levels. According to the principles of the present disclosure, a memory controller may determine optimum defined levels and may send the actual level information to the memory chip. In addition, during a read, the measurements of storage elements may be relayed to the memory controller. The memory controller may apply more advanced processing to extract valid data. This is in contrast to the memory chip making hard decisions based on the measurements and returning sometimes incorrect user data.

Figure 4:
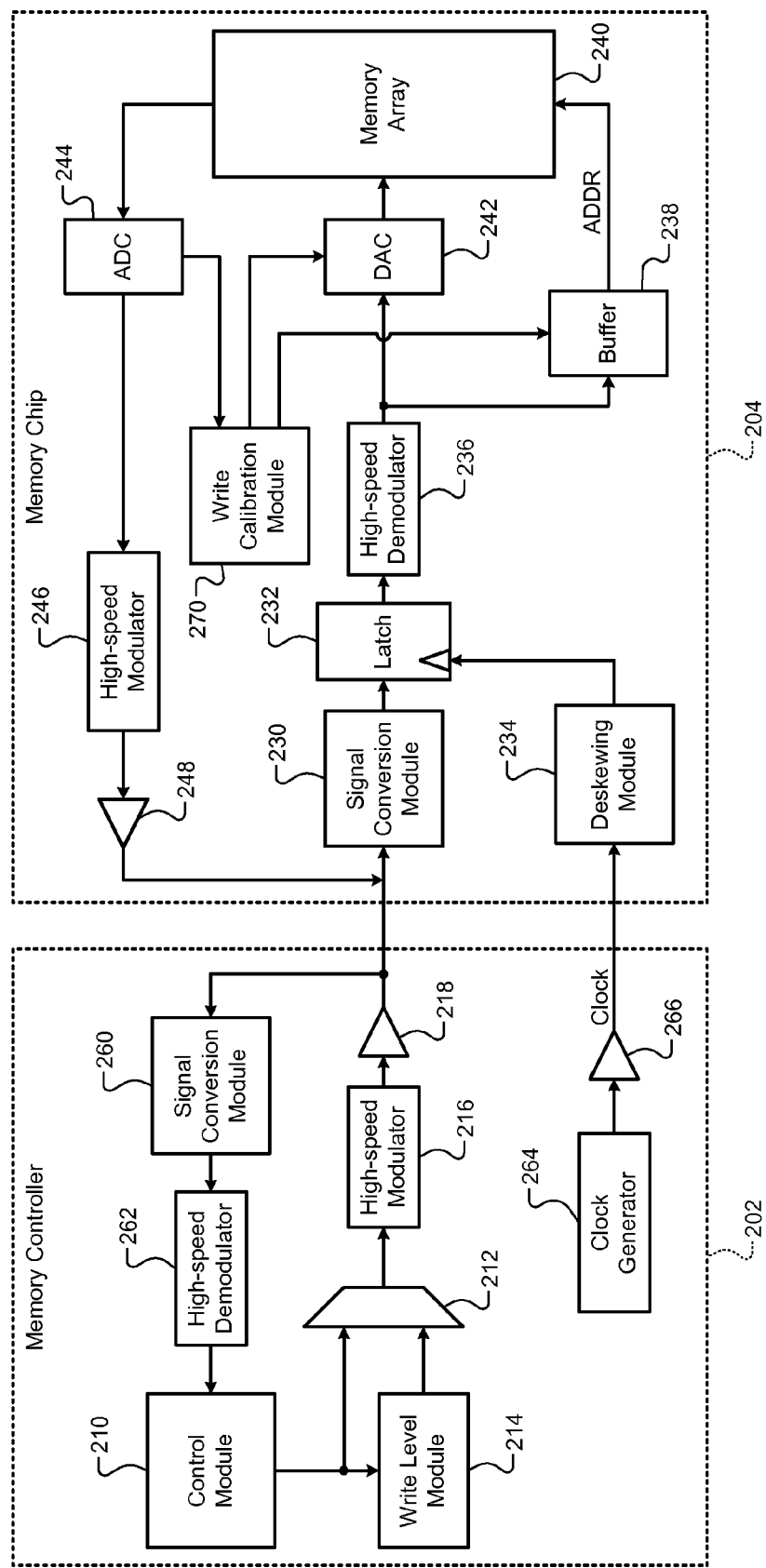
FIG. 4 is a functional block diagram of an exemplary memory controller that sends and receives digital data representing level information to a memory chip.

FIG. 4 depicts an approach where the memory controller transmits digital data to the memory chip indicating programming parameters to program a storage element to a defined level. For example, the memory controller may receive user data, which can be represented in a storage element as a first defined level. The memory controller will then provide programming parameters to the memory chip that will cause a storage element in the memory chip to reach the first defined level.

For example, the first defined level may define a first quantity of charge in a charge-storage-based storage element, which will result in the storage element having a first threshold voltage. The programming parameters the memory controller provides may include a programming voltage and/or a programming time that will raise the quantity of charge in the storage element to the first quantity. The memory chip may then program the storage element at the specified programming voltage for the specified programming time.

To perform a read, the memory chip measures the level of the storage element. For example, the memory chip may apply a voltage to the storage element, and measure the resulting current. This may be an indication of the threshold voltage of the storage element, which indicates the amount of charge stored in the storage element.

The memory chip of FIG. 4 converts the measured value into a digital value, which is returned to the memory controller. This digital value is not a hard decision on what user data was stored, but instead represents the level that was read. The memory controller can then process this information to determine which defined level was originally written, which is then mapped to user data.

Figure 5:
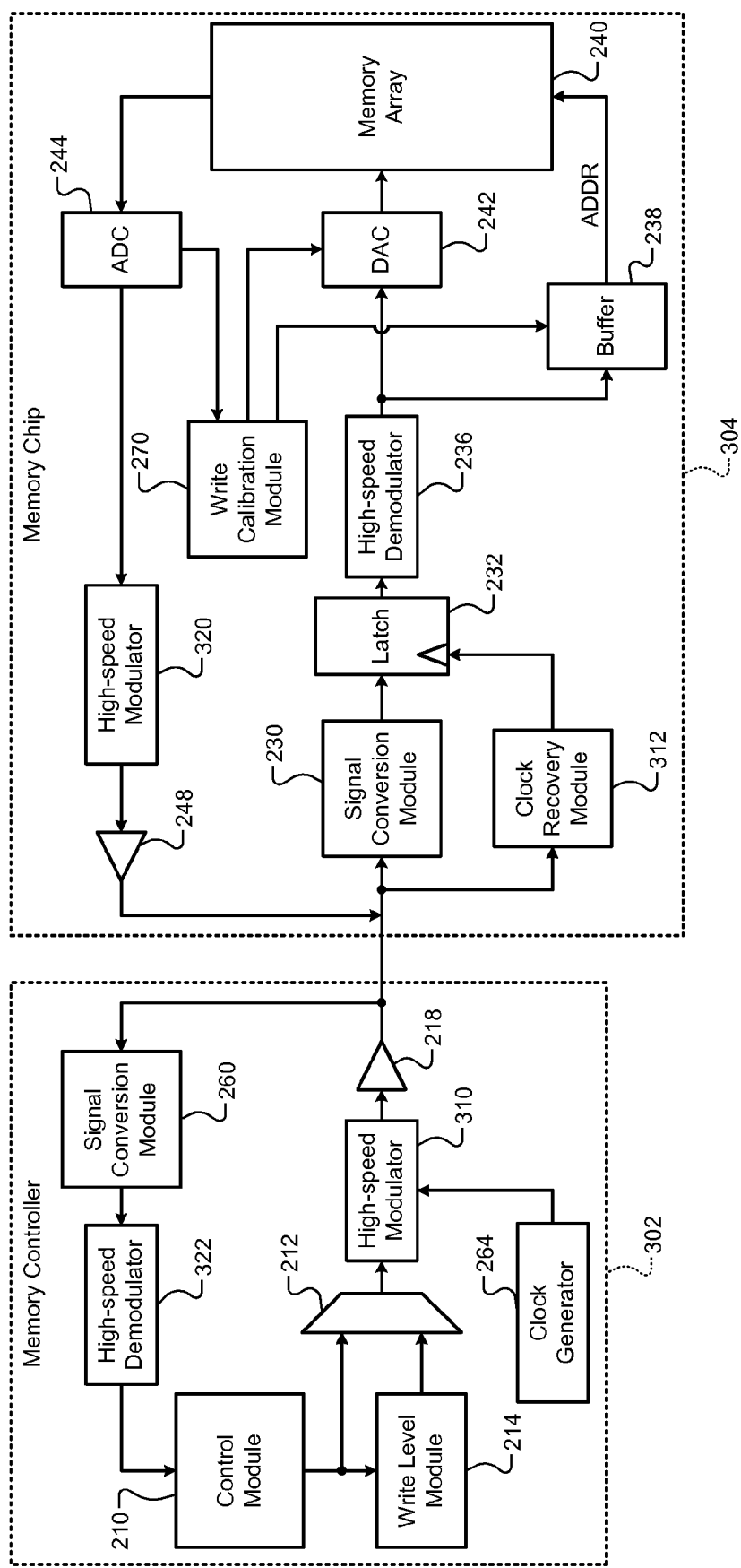
FIG. 5 is a functional block diagram of an exemplary memory controller that communicates with the memory chip using an embedded clock.
Figure 6:
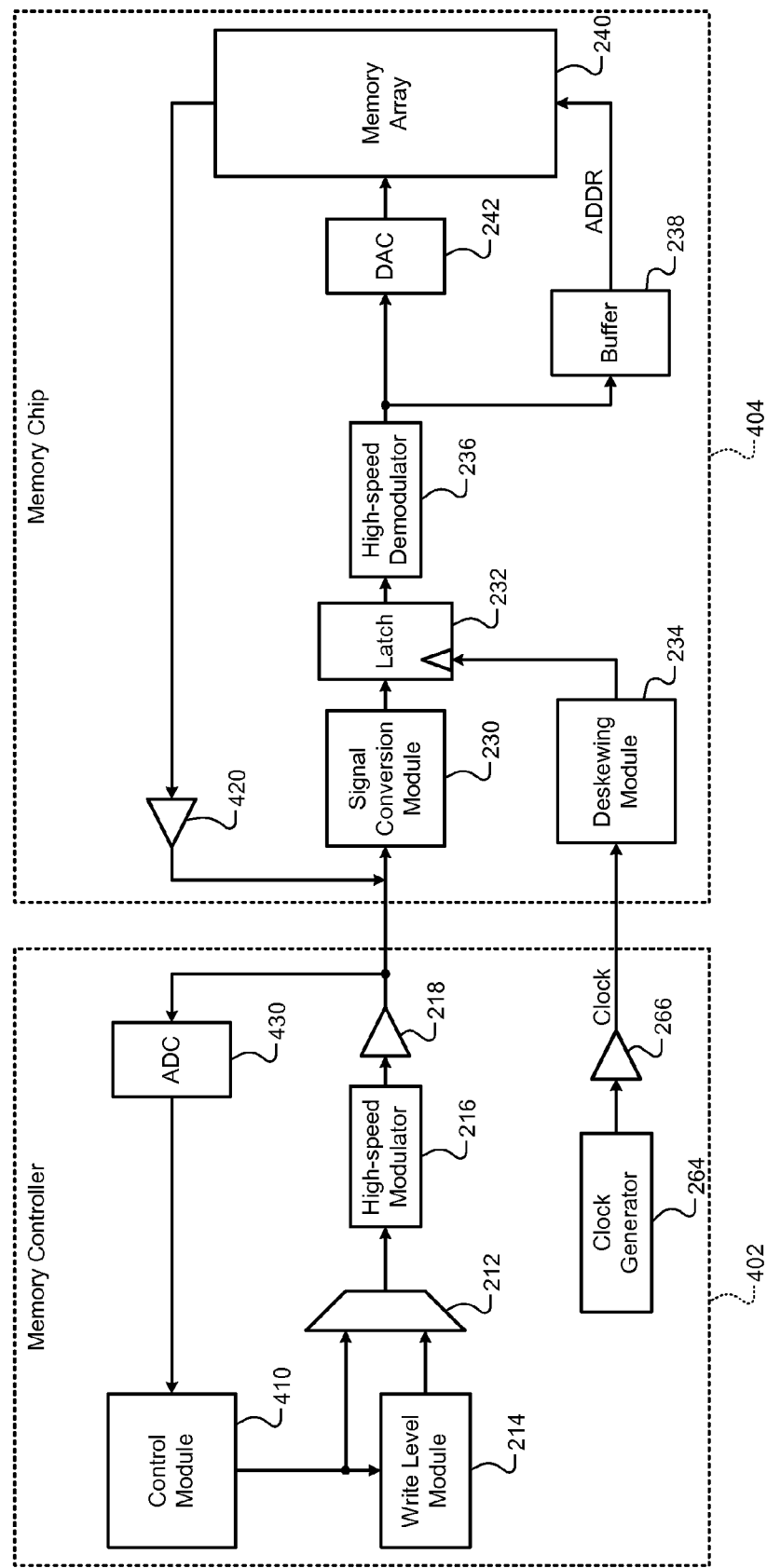
FIG. 6 is a functional block diagram of an exemplary memory controller that transmits digital write information to a memory chip and receives analog read information.

FIG. 5 depicts a system similar to that of FIG. 4, except that a separate clock used to transfer digital data between the memory controller and memory chip is eliminated. Instead, an embedded clock is used along with clock recovery. FIG. 6 is a system where the memory chip does not include an analog to digital converter. Accordingly, the memory chip returns an analog value to the memory controller, which then converts that value to digital form.

Figure 7:
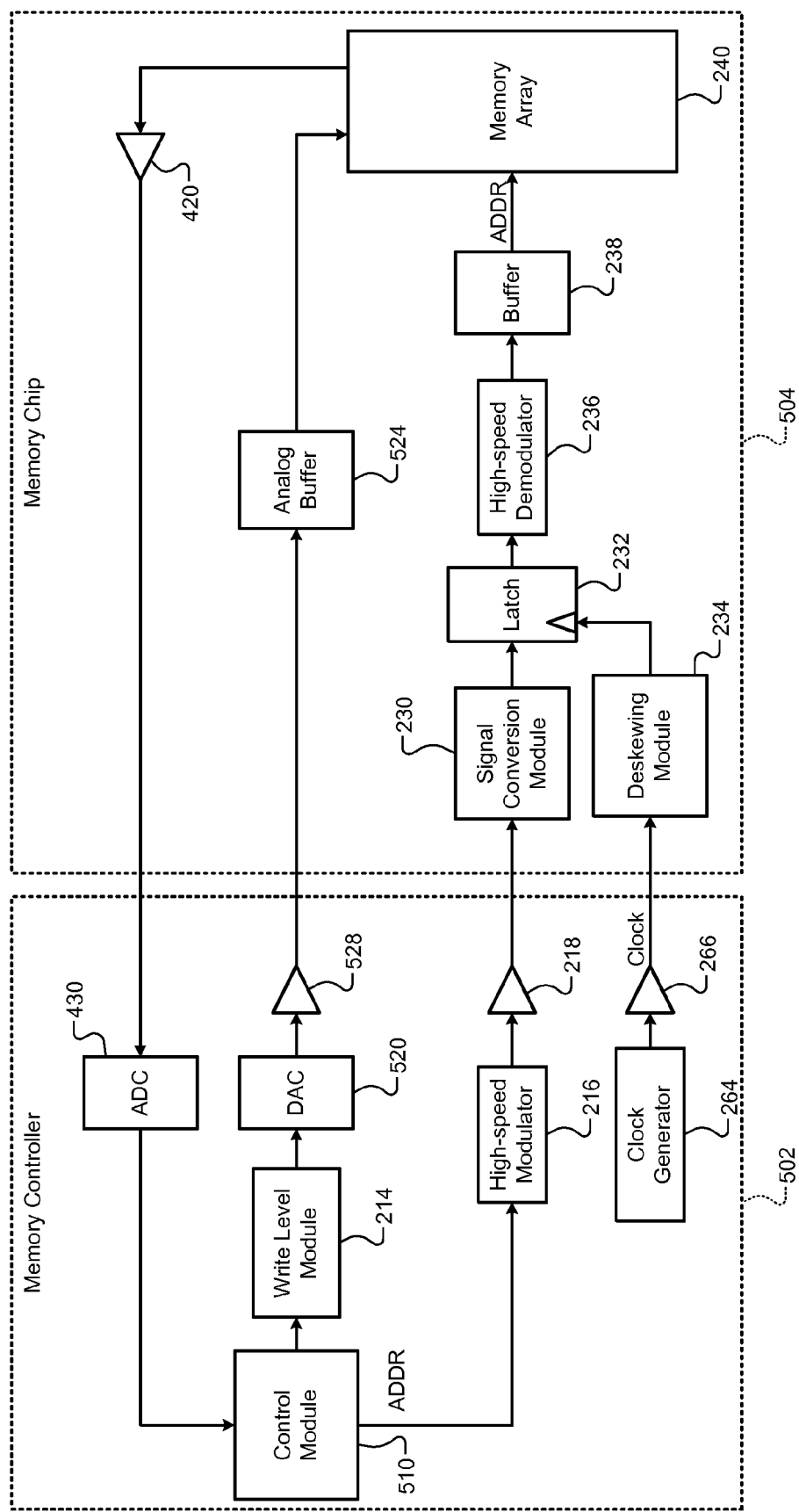
FIG. 7 is a functional block diagram of an exemplary memory controller that sends analog write data to a memory chip and receives analog read data.

Due to the complexity, mixed signal requirements, and layout space, moving the analog to digital converter to the memory controller may save money on each memory chip that is used in the system. In FIG. 7, the digital to analog converter is relocated to the memory controller. The memory controller therefore sends analog write information and receives analog read information. Address information may still be sent digitally, as shown in FIG. 7.

Figure 8:
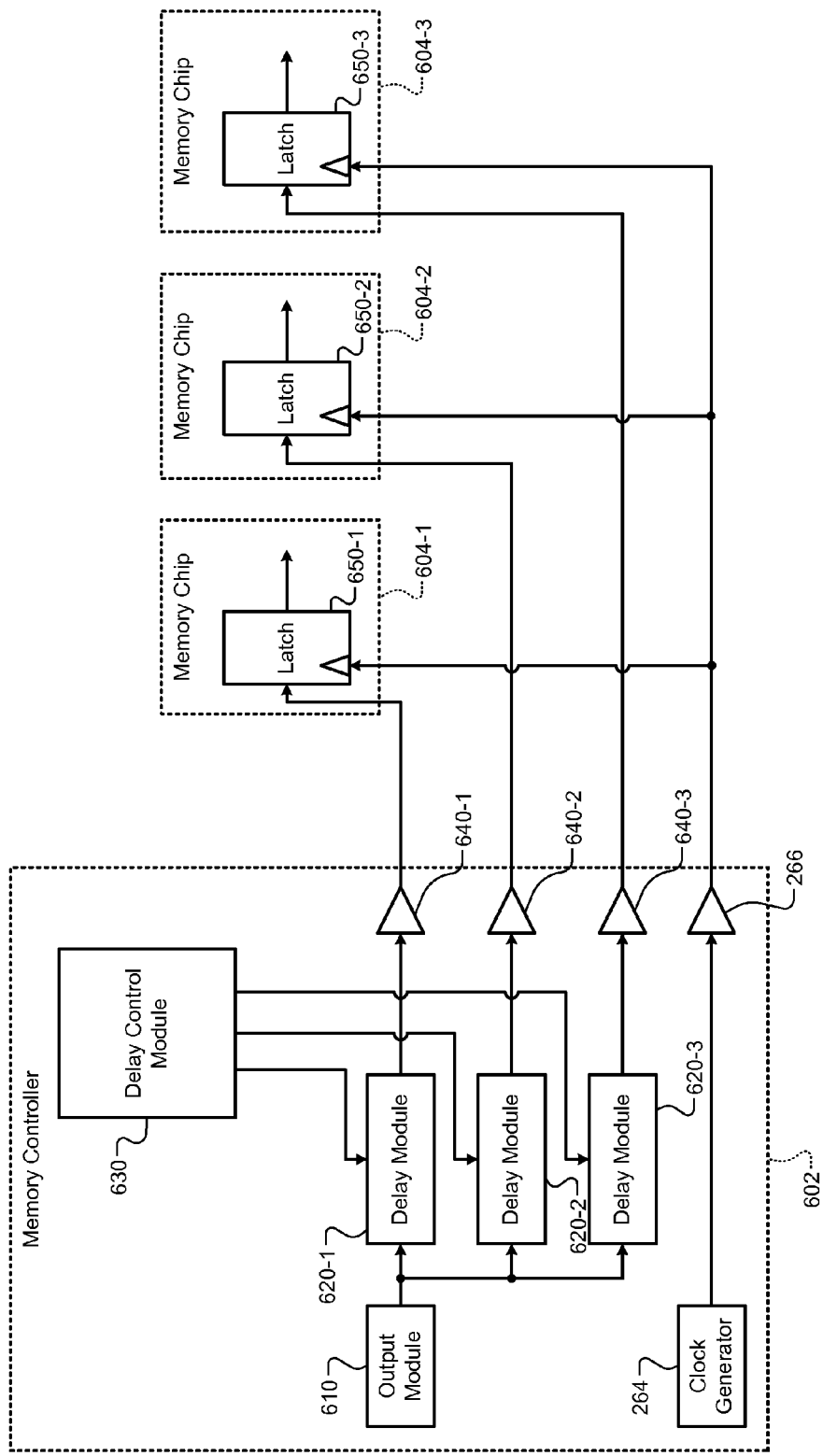
FIG. 8 is a functional block diagram of an exemplary system where deskewing circuitry is moved to a memory controller from memory chips.

FIG. 8 shows an exemplary implementation of clock deskewing in the memory controller. By varying the delay in digital signals sent to the memory chip, the clock received by memory chip can be used directly to latch data. For example, in FIG. 8, the memory controller includes a delay module for each of the memory chips to align data for each of the chips with the clock. FIGS. 9A-9G depict exemplary devices in which memory controllers and chips according to the present disclosure may be used.

Referring now to FIG. 4, a memory controller 202 that sends and receives digital data representing level information to a memory chip 204 is presented. The memory controller 202 includes a control module 210. The control module 210 receives access (read and write) requests from a host (not shown).

The control module 210 outputs address and data information to a multiplexer 212 and a write level module 214. For address information, the multiplexer 212 outputs the address information from the control module 210 to a high-speed modulator 216. When the control module 210 outputs data, the write level module 214 may convert user data into digital level data. The multiplexer 212 then outputs this digital level data to the high-speed modulator 216. The write level module 214 may store a mapping table, received from the control module 210, of user data to programming parameters for defined levels.

The programming parameters may include programming voltages/currents, programming times, programming pulse widths, etc. Additionally or alternatively, the programming parameters may include a desired storage element parameter. This may be used as a target for open-loop or closed-loop programming. For example, when using a charge storage element, the desired storage element parameter may be a desired threshold voltage or a desired current at a predetermined read voltage. For example, when using a phase-change storage element, the desired storage element parameter may be a desired resistance.

The high-speed modulator 216 converts the received information into a serial stream, which is output from the memory controller 202 by a line driver 218. The high-speed modulator 216 may include a serializer, which may be implemented as part of a serializer/deserializer, and may include a high-speed multi-bit link. A signal conversion module 230 in the memory chip 204 receives the data from the line driver 218. The data from the line driver 218 may be carried by a low voltage differential signaling (LVDS) interface, and the signal conversion module 230 may include a differential amplifier.

The memory chip 204 includes a latch 232, which latches an output of the signal conversion module 230 based on a received clock signal. The received clock signal may be interpreted by a deskewing module 234. The deskewing module 234 may include, for example, a delay locked loop, a phase locked loop, and/or a calibrated delay element.

An output of the latch 232 is received by a high-speed demodulator 236. The high-speed demodulator 236 may include a deserializer, which may be implemented as part of a serializer/deserializer, and may include a high-speed multi-bit link. The high-speed demodulator 236 outputs address and data information. Indication of whether the information is address or data may be included in the serial stream or may be indicated by sideband data, such as a separate control line or bus. Address information may be received by a digital buffer 238. The buffer 238 then presents one or more addresses to a memory array 240 for reading or writing.

Data information may be received by a digital to analog converter (DAC) 242. The data information may include one or more programming parameters for programming a storage element of the memory array 240 to a desired level. The DAC 242 applies an analog version of the received digital value to the memory array 240.

If multiple storage elements will be programmed in the memory array 240 at the same time, a buffer (not shown) may be inserted between the DAC 242 and the memory array 240. The buffer can then accumulate analog values from the DAC 242 and present them to the memory array 240 for programming. Additionally or alternatively, multiple instances of the DAC 242 may produce analog output values in parallel.

The analog values may represent target values, such as target threshold voltages or target resistances. In various implementations, instead of being measured directly, these values may be inferred from values such as measured currents or measured voltages. These values may be measured when a known voltage or current is applied to the cell.

In open-loop programming, these values may not be measured until the storage element is read. In closed-loop programming, these values may be measured after each iteration of programming. Closed-loop programming may complete once the measured value differs from the target value by less than a predetermined amount. This predetermined amount may be, for example, a percentage or an absolute value. The predetermined amount may be proportional to the maximum number of defined levels in the storage element. For example, if there are up to four defined levels for a measured parameter of a storage cell, the predetermined amount may be a predetermined percentage of a quarter of the possible range of the measured parameter.

During a read, the buffer 238 presents the address to the memory array 240. The memory array 240 outputs analog values to an analog to digital converter (ADC) 244. The memory array 240 may output multiple analog values from multiple storage elements to multiple instances of the ADC 244. In various other implementations, the memory array 240 may output in sequence a number of analog values to the ADC 244. Each of these values may be produced by a new address received from the buffer 238, or may be output based on logic internal to the memory array 240.

The ADC 244 outputs digital values to a high-speed modulator 246. An output of the high-speed modulator 246 is output to the memory controller 202 via a line driver 248. In various implementations, the serial link between the memory controller 202 and the memory chip 204 may be multiplexed between transmitting write data to the memory chip 204 and returning read data to the memory controller 202.

While receiving write data, the line driver 248 may be tristated—i.e., its output placed into a high impedance state. Similarly, while receiving read data, the line driver 218 may be tristated. If duplex operation is desired, the line driver 248 may output read data to the memory controller 202 via a second serial link. If greater throughput is desired, a separate serial link may be added for address information, while the original serial link is used for data information. In addition, the system of FIG. 4 may support various forms of burst mode, such as where a single address is sent followed by multiple pieces of data for that and subsequent addresses.

Data output by the line driver 248 is received by a signal conversion module 260 in the memory controller 202. The signal conversion module 260 may include a differential amplifier, which outputs data to a high-speed demodulator 262. The high-speed demodulator 262 outputs digital values from the memory chip 204 to the control module 210. These digital values may indicate the levels read from storage elements in the memory array 240. For example, the digital values may represent threshold voltages of storage elements. Alternately, the digital values may represent measured currents, which may be converted into threshold voltages.

The control module 210 interprets the received values to recover the user data that had been stored in the memory array 240. For example, the control module 210 may have a mapping for each of the connected memory chips, including the memory chip 204. For example, each mapping may be from user data to defined threshold voltages. The control module 210 may recover the user data by identifying which one of the defined threshold voltages is closest to the received threshold voltage. The mapping is then used to determine the user data corresponding to the identified threshold voltage.

The control module 210 may be programmed with level information for the memory chip 204 at the time of assembly. For example, the memory chip 204, or the lot or wafer from which the memory chip 204 is taken, may be characterized. Characterization may determine how many defined levels can be stored in storage elements of the memory chip 204 and how closely spaced each of the defined levels should be. The values from calibration may be stored into firmware of the memory controller 202 after the memory controller 202 and the memory chip 204 are placed on a circuit board.

In various implementations, there may be a number of discrete levels available. For example, a phase-change storage element may include two phase-change regions, each of which may be in a crystalline or non-crystalline state. The phase-change storage element may then offer four discrete resistances based on the state of each phase-change region. Characterization may involve determining whether each of the discrete levels is achievable. Characterization may also include determining the programming parameters used to program the storage elements to each of the discrete levels.

Additionally or alternatively, the control module 210 may itself perform characterization. This may be performed upon power on, at times specified by the host, and/or at periodic intervals during use of the memory chip 204. For example, the control module 210 may perform characterization by writing and reading test values to determine optimum levels.

Characterization may result in a mapping table that maps each value of user data to a defined level and one or more associated programming parameters. The control module 210 may store a mapping table for each connected memory chip, including the memory chip 204. The control module 210 may also store multiple mapping tables corresponding to different areas of the memory chip 204. For example, for memory blocks that have higher error rates, the control module 210 may store a mapping table including fewer defined levels. The control module 210 may use error control coding to protect data written to the memory chip 204. The control module 210 may also adapt mapping tables based on error rates, changing the defined levels in the mapping table until data stored using that mapping table experiences a lower error rate.

Storage elements may degrade and/or experience changes in properties as the number of erases, writes, and/or reads increases. For example, the control module 210 may store mapping tables for different numbers of erases. When data is written to storage element, the number of erases the storage element has experienced determines the mapping table used. The mapping table or tables may be sent to the write level module 214, which can subsequently translate each write request into appropriate programming parameters.

The memory controller 202 includes a clock generator 264, whose output is driven to the memory chip 204 using a line driver 266. The dedicated clock signal may allow for rapid power-up and power-down of the memory chip 204. The clock may also be used by the memory controller 202 to receive data from the memory chip 204. The clock generator 264 may further generate one or more clocks for other components of the memory controller 202. For example, a latch (not shown) similar to the latch 232 of the memory chip 204 may be implemented in the memory controller 202 between the signal conversion module 260 and the high-speed demodulator 262.

The memory chip 204 may also include a write calibration module 270. For example, in phase-change memory (PCM), write calibration may be performed within the memory chip 204. The write calibration module 270 may output address data to the buffer 238 and level information to the DAC 242 and may receive read information from the ADC 244. In implementations where the memory chip 204 does not include the write calibration module 270, the ADC 244 may not be required and may be moved to the memory controller 202, as shown in FIG. 6.

Referring now to FIG. 5, a memory controller 302 that communicates with a memory chip 304 using an embedded clock is depicted. The memory controller 302 includes a high-speed modulator 310 that receives the output of the multiplexer 212. The high-speed modulator 310 may include clock and coding circuitry that encodes a clock signal into the bits to be transmitted. For example, the high-speed modulator 310 may use a line code, such as Manchester coding, 8B/10B, or non-return-to-zero. The line driver 218 then drives the signal to the memory chip 304.

The signal is received by the signal conversion module 230. The signal is also received by a clock recovery module 312. Alternatively, the clock recovery module 312 may receive the output of the signal conversion module 230. The clock recovery module 312 recovers the embedded clock and outputs the recovered clock to the clock input of the latch 232.

When transmitting read data to the memory controller 302, a high-speed modulator 320 in the memory chip 304 may use the clock recovered by the clock recovery module 312. Alternatively, the high-speed modulator 320 may embed the recovered clock or another clock into the data. The memory controller 302 includes a high-speed demodulator 322, which may extract a clock embedded by the high-speed modulator 320. Alternatively, the high-speed demodulator 322 may use the clock from the clock generator 264 of the memory controller 302.

Referring now to FIG. 6, a memory controller 402 that transmits digital write information to a memory chip 404 and receives analog read information is shown. A control module 410 in the memory controller 402 outputs user data to the write level module 214 and address information to the multiplexer 212. The write level module 214 converts user data into digital programming parameters for storing a defined level corresponding to that data.

The output of the write level module 214 is sent to the high-speed modulator 216. The memory controller 402 outputs serialized digital information via the line driver 218. This information may be data information to be translated by the DAC 242 or may be address information. When a read is performed, the memory array 240 outputs one or more analog values to an analog line driver 420. The analog line driver 420 outputs these analog values to an ADC 430 of the memory controller 402.

The control module 410 receives digital data from the ADC 430 indicating the analog values read from the memory array 240. The control module 410 then converts these values into user data. As shown in FIG. 6, the bus between the memory controller 402 and the memory chip 404 may be multiplexed to carry both digital and analog data. However, to optimize the design for each of these types of data and/or to improve signal integrity, a separate digital bus and analog bus may be created. The analog line driver 420 could then transmit data to the ADC 430 using the analog bus.

Referring now to FIG. 7, a memory controller 502 that sends analog write data to a memory chip 504 and receives analog read data is shown. In various implementations, such as that shown in FIG. 7, the address data is still sent digitally. A control module 510 outputs digital address data to the high-speed modulator 216. The digital address data is transmitted to the memory chip 504 via the line driver 218. Alternatively, the digital address data may be transmitted to the memory chip 504 using a parallel bus.

The digital address data is applied to the memory array 240 by the buffer 238. The analog output of the memory array 240 is transmitted to the ADC 430 of the memory controller 502 by the analog line driver 420. The control module 510 outputs write data to the write level module 214. The write level module 214 translates this data into digital programming parameters, which are output to a DAC 520.

The DAC 520 converts the programming parameters into analog values that are sent to an analog buffer 524 of the memory chip 504 via a second analog line driver 528. The analog buffer 524 may amplify the signal received from the second analog line driver 528. In addition, the analog buffer 524 may buffer multiple analog signals, which may then be applied in parallel or sequentially to the memory array 240.

In various implementations, a multiplexed bus may be used between the second analog line driver 528 and the analog buffer 524 and the analog line driver 420 and the ADC 430, as shown in FIG. 6. In various implementations, the memory chip 504 may include the ADC 430, and output digital data to the memory controller 502.

Referring now to FIG. 8, a system where deskewing circuitry is moved to a memory controller 602 from memory chips 604 is shown. By including deskewing circuitry, the memory controller 602 removes the burden of deskewing from the memory chips 604, of which three are shown, 604-1, 604-2, and 604-3. The memory controller 602 includes the clock generator 264 and the line driver 266, which drives the clock from the clock generator 264 to the memory chips 604.

The memory controller 602 includes an output module 610, which outputs data for the memory chips 604. The output module 610 may include the write level module 214 and/or the high-speed modulator 216 of FIG. 4 and/or may include any other module in the memory controller 602 that transmits data to the memory chips 604. The values from the output module are received by three delay modules 620-1, 620-2, and 620-3, which correspond to the memory chip 604-1, the memory chip 604-2, and the memory chip 604-3, respectively.

The delay modules 620 are controlled by a delay control module 630. The delay control module 630 may receives feedback from the memory chips 604 and adjust the amount of delay introduced by each of the delay modules 620. For example, the delay control module 630 may receive signal quality information from the latch modules 650, and adjust the delay of the delay modules 620 until adequate signal integrity is achieved. The delay modules 620 delay the signals from the output module 610, and these signals are driven to the memory chips 604 by line drivers 640-1, 640-2, and 640-3, respectively.

In various implementations, the delay control module 630 may include a lookup table that stores delay values for the delay modules 620. The lookup table may be created when the system is assembled or designed. In various implementations, the delay control module 630 may send a time-varying pattern of data to the memory chips 604. The memory chips 604 may transmit to the delay control module 630 the values received. The delay control module 630 may use this information to determine the appropriate delay. The delay control module 630 may increase or decrease the delay by small increments for the memory chips 604 that do not return valid data.

The driven values are then latched by latch modules 650-1, 650-2, and 650-3 in the memory chips 604-1, 604-2, and 604-3, respectively. The latch modules 650 are clocked by the clock received from the line driver 266. By adjusting the amount of delay introduced by the delay modules 620, the delay control module 630 can ensure that the data arrives at the latch modules 650 synchronously with the clock signal.

If memory chip 604-1 is located closer to the memory controller 602, the delay introduced by the delay module 620-1 may be greater to offset the shorter distance to reach the memory chip 604-1. While multiple delay modules adjust the data in FIG. 8, in various other implementations, multiple delay modules may adjust the clock while a single data stream is output. In such implementations, the delay control module 630 would control the delay introduced to each clock signal, so that they are synchronously received with the data at each of the memory chips 604.

Figure 9A:
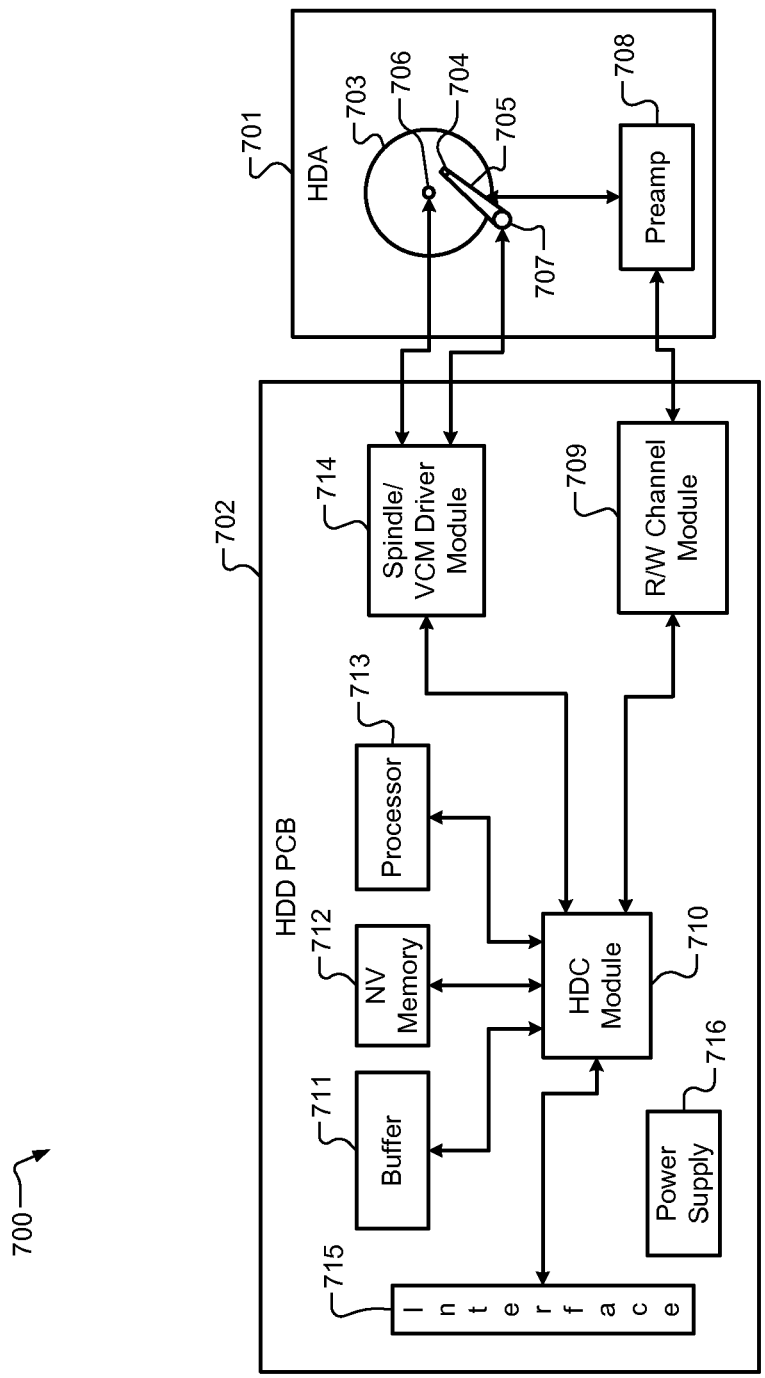
FIG. 9A is a functional block diagram of a hard disk drive.

In FIGS. 9A-9G, various exemplary implementations incorporating the teachings of the present disclosure are shown. Referring now to FIG. 9A, the teachings of the disclosure can be implemented in a buffer 711 and/or nonvolatile memory 712 of a hard disk drive (HDD) 700. The HDD 700 includes a hard disk assembly (HDA) 701 and an HDD printed circuit board (PCB) 702. The HDA 701 may include a magnetic medium 703, such as one or more platters that store data, and a read/write device 704.

The read/write device 704 may be arranged on an actuator arm 705 and may read and write data on the magnetic medium 703. Additionally, the HDA 701 includes a spindle motor 706 that rotates the magnetic medium 703 and a voice-coil motor (VCM) 707 that actuates the actuator arm 705. A preamplifier device 708 amplifies signals generated by the read/write device 704 during read operations and provides signals to the read/write device 704 during write operations.

The HDD PCB 702 includes a read/write channel module (hereinafter, "read channel") 709, a hard disk controller (HDC) module 710, the buffer 711, nonvolatile memory 712, a processor 713, and a spindle/VCM driver module 714. The read channel 709 processes data received from and transmitted to the preamplifier device 708. The HDC module 710 controls components of the HDA 701 and communicates with an external device (not shown) via an I/O interface 715. The external device may include a computer, a multimedia device, a mobile computing device, etc. The I/O interface 715 may include wireline and/or wireless communication links.

The HDC module 710 may receive data from the HDA 701, the read channel 709, the buffer 711, nonvolatile memory 712, the processor 713, the spindle/VCM driver module 714, and/or the I/O interface 715. The processor 713 may process the data, including encoding, decoding, filtering, and/or formatting. The processed data may be output to the HDA 701, the read channel 709, the buffer 711, nonvolatile memory 712, the processor 713, the spindle/VCM driver module 714, and/or the I/O interface 715.

The HDC module 710 may use the buffer 711 and/or nonvolatile memory 712 to store data related to the control and operation of the HDD 700. The buffer 711 may include DRAM, SDRAM, etc. Nonvolatile memory 712 may include any suitable type of semiconductor or solid-state memory, such as flash memory (including NAND and NOR flash memory), phase-change memory, magnetic RAM, and multi-state memory, in which each memory cell has more than two states. The spindle/VCM driver module 714 controls the spindle motor 706 and the VCM 707. The HDD PCB 702 includes a power supply 716 that provides power to the components of the HDD 700.

Figure 9B:
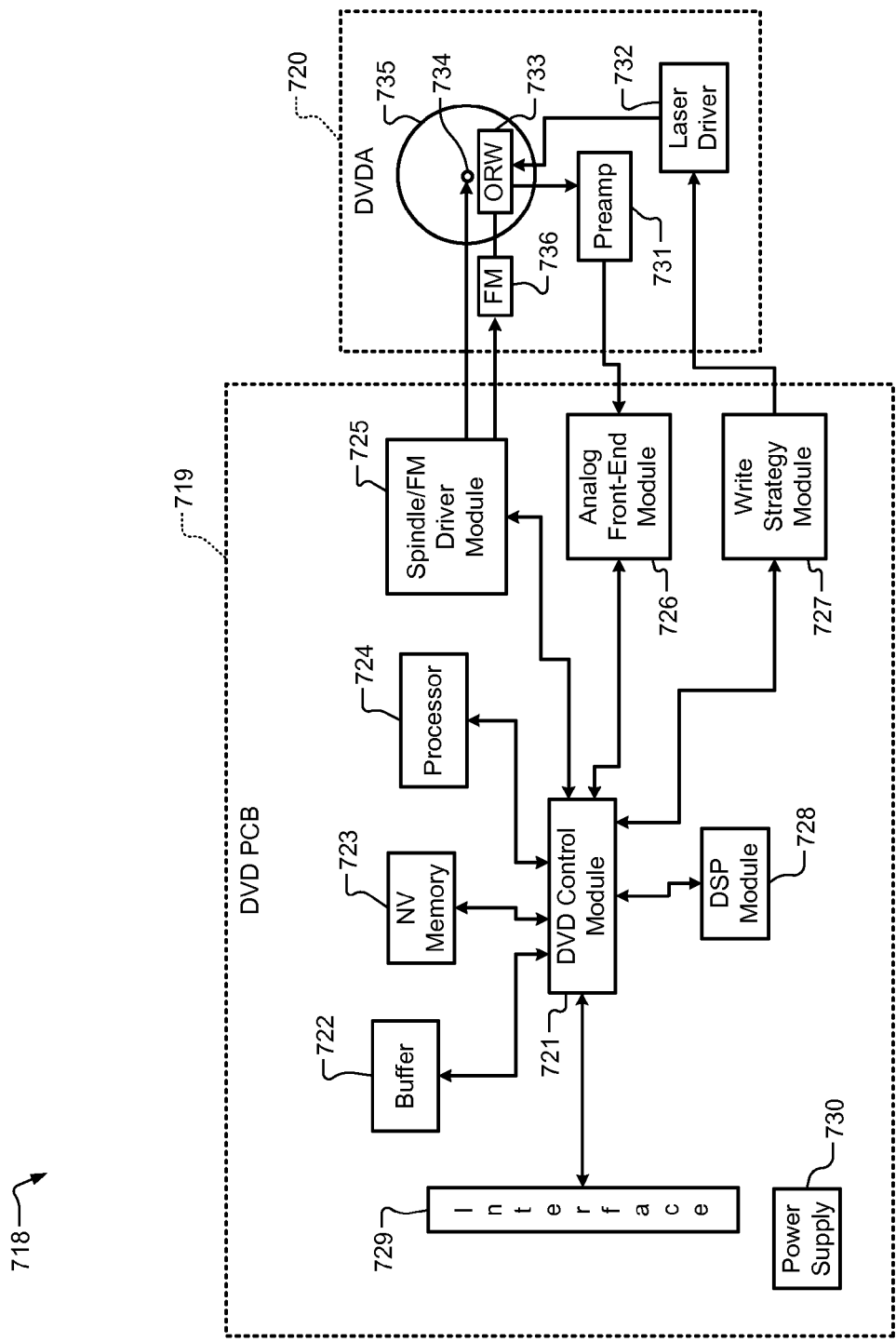
FIG. 9B is a functional block diagram of a DVD drive.

Referring now to FIG. 9B, the teachings of the disclosure can be implemented in a buffer 722 and/or nonvolatile memory 723 of a DVD drive 718 or of a CD drive (not shown). The DVD drive 718 includes a DVD PCB 719 and a DVD assembly (DVDA) 720. The DVD PCB 719 includes a DVD control module 721, the buffer 722, nonvolatile memory 723, a processor 724, a spindle/FM (feed motor) driver module 725, an analog front-end module 726, a write strategy module 727, and a DSP module 728.

The DVD control module 721 controls components of the DVDA 720 and communicates with an external device (not shown) via an I/O interface 729. The external device may include a computer, a multimedia device, a mobile computing device, etc. The I/O interface 729 may include wireline and/or wireless communication links.

The DVD control module 721 may receive data from the buffer 722, nonvolatile memory 723, the processor 724, the spindle/FM driver module 725, the analog front-end module 726, the write strategy module 727, the DSP module 728, and/or the I/O interface 729. The processor 724 may process the data, including encoding, decoding, filtering, and/or formatting. The DSP module 728 performs signal processing, such as video and/or audio coding/decoding. The processed data may be output to the buffer 722, nonvolatile memory 723, the processor 724, the spindle/FM driver module 725, the analog front-end module 726, the write strategy module 727, the DSP module 728, and/or the I/O interface 729.

The DVD control module 721 may use the buffer 722 and/or nonvolatile memory 723 to store data related to the control and operation of the DVD drive 718. The buffer 722 may include DRAM, SDRAM, etc. Nonvolatile memory 723 may include any suitable type of semiconductor or solid-state memory, such as flash memory (including NAND and NOR flash memory), phase-change memory, magnetic RAM, and multi-state memory, in which each memory cell has more than two states. The DVD PCB 719 includes a power supply 730 that provides power to the components of the DVD drive 718.

The DVDA 720 may include a preamplifier device 731, a laser driver 732, and an optical device 733, which may be an optical read/write (ORW) device or an optical read-only (OR) device. A spindle motor 734 rotates an optical storage medium 735, and a feed motor 736 actuates the optical device 733 relative to the optical storage medium 735.

When reading data from the optical storage medium 735, the laser driver provides a read power to the optical device 733. The optical device 733 detects data from the optical storage medium 735, and transmits the data to the preamplifier device 731. The analog front-end module 726 receives data from the preamplifier device 731 and performs such functions as filtering and A/D conversion. To write to the optical storage medium 735, the write strategy module 727 transmits power level and timing data to the laser driver 732. The laser driver 732 controls the optical device 733 to write data to the optical storage medium 735.

Figure 9D:
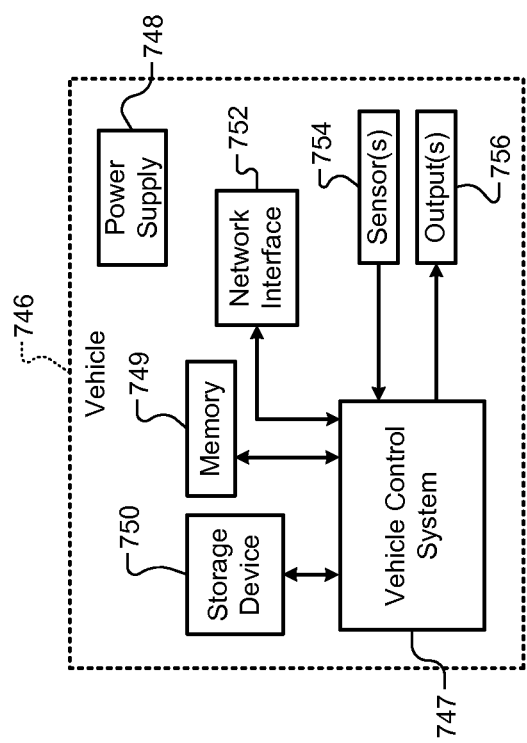
FIG. 9D is a functional block diagram of a vehicle control system.
Figure 9C:
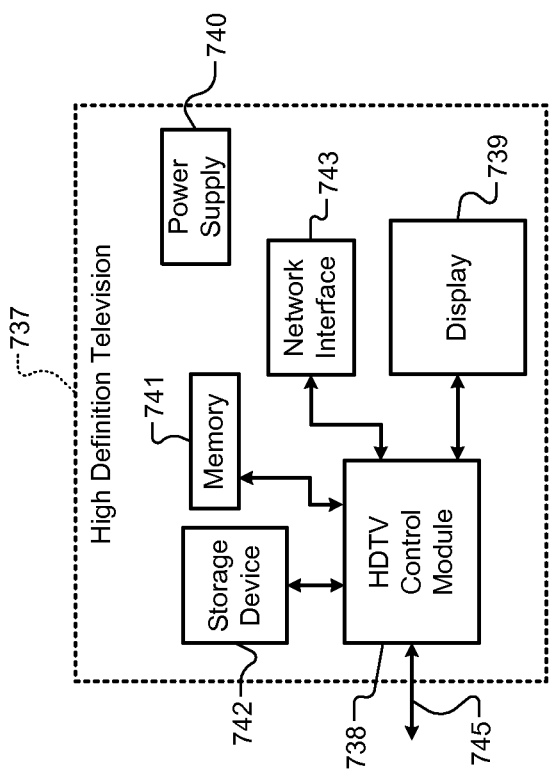
FIG. 9C is a functional block diagram of a high definition television.

Referring now to FIG. 9C, the teachings of the disclosure can be implemented in memory 741 and/or a storage device 742 of a high definition television (HDTV) 737. The HDTV 737 includes an HDTV control module 738, a display 739, a power supply 740, memory 741, the storage device 742, a network interface 743, and an external interface 745. If the network interface 743 includes a wireless local area network interface, an antenna (not shown) may be included.

The HDTV 737 can receive input signals from the network interface 743 and/or the external interface 745, which can send and receive data via cable, broadband Internet, and/or satellite. The HDTV control module 738 may process the input signals, including encoding, decoding, filtering, and/or formatting, and generate output signals. The output signals may be communicated to one or more of the display 739, memory 741, the storage device 742, the network interface 743, and the external interface 745.

Memory 741 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 742 may include an optical storage drive, such as a DVD drive, and/or a hard disk drive (HDD). The HDTV control module 738 communicates externally via the network interface 743 and/or the external interface 745. The power supply 740 provides power to the components of the HDTV 737.

Referring now to FIG. 9D, the teachings of the disclosure may be implemented in memory 749 and/or a storage device 750 of a vehicle 746. The vehicle 746 may include a vehicle control system 747, a power supply 748, memory 749, the storage device 750, and a network interface 752. If the network interface 752 includes a wireless local area network interface, an antenna (not shown) may be included. The vehicle control system 747 may be a powertrain control system, a body control system, an entertainment control system, an anti-lock braking system (ABS), a navigation system, a telematics system, a lane departure system, an adaptive cruise control system, etc.

The vehicle control system 747 may communicate with one or more sensors 754 and generate one or more output signals 756. The sensors 754 may include temperature sensors, acceleration sensors, pressure sensors, rotational sensors, airflow sensors, etc. The output signals 756 may control engine operating parameters, transmission operating parameters, suspension parameters, etc.

The power supply 748 provides power to the components of the vehicle 746. The vehicle control system 747 may store data in memory 749 and/or the storage device 750. Memory 749 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 750 may include an optical storage drive, such as a DVD drive, and/or a hard disk drive (HDD). The vehicle control system 747 may communicate externally using the network interface 752.

Figure 9F:
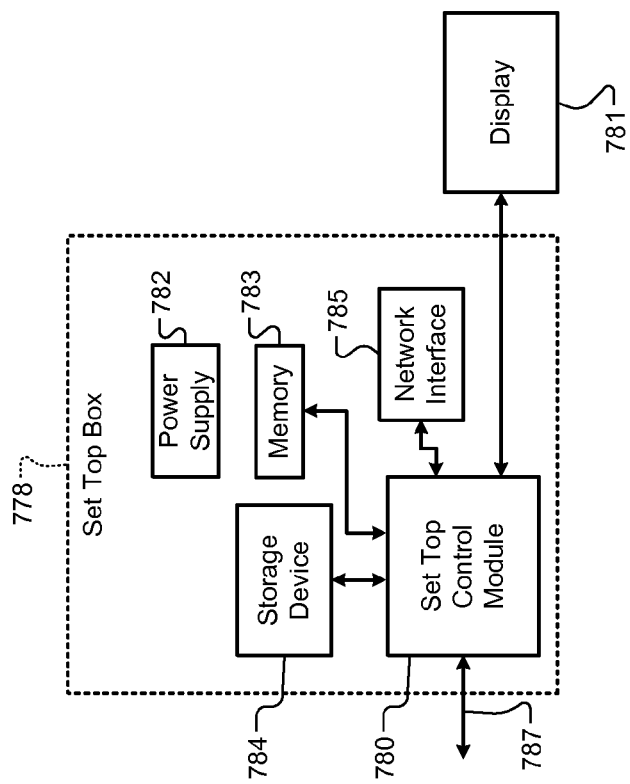
FIG. 9F is a functional block diagram of a set top box.
Figure 9E:
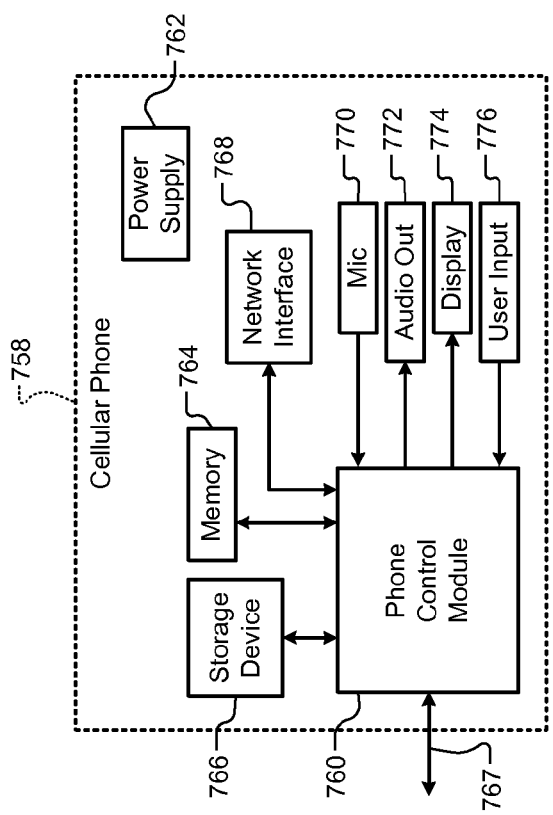
FIG. 9E is a functional block diagram of a cellular phone.

Referring now to FIG. 9E, the teachings of the disclosure can be implemented in memory 764 and/or a storage device 766 of a cellular phone 758. The cellular phone 758 includes a phone control module 760, a power supply 762, memory 764, the storage device 766, and a cellular network interface 767. The cellular phone 758 may include a network interface 768, a microphone 770, an audio output 772 such as a speaker and/or output jack, a display 774, and a user input device 776 such as a keypad and/or pointing device. If the network interface 768 includes a wireless local area network interface, an antenna (not shown) may be included.

The phone control module 760 may receive input signals from the cellular network interface 767, the network interface 768, the microphone 770, and/or the user input device 776. The phone control module 760 may process signals, including encoding, decoding, filtering, and/or formatting, and generate output signals. The output signals may be communicated to one or more of memory 764, the storage device 766, the cellular network interface 767, the network interface 768, and the audio output 772.

Memory 764 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 766 may include an optical storage drive, such as a DVD drive, and/or a hard disk drive (HDD). The power supply 762 provides power to the components of the cellular phone 758.

Referring now to FIG. 9F, the teachings of the disclosure can be implemented in a memory 783 and/or a storage device 784 of a set top box 778. The set top box 778 includes a set top control module 780, a display 781, a power supply 782, memory 783, the storage device 784, and a network interface 785. If the network interface 785 includes a wireless local area network interface, an antenna (not shown) may be included.

The set top control module 780 may receive input signals from the network interface 785 and an external interface 787, which can send and receive data via cable, broadband Internet, and/or satellite. The set top control module 780 may process signals, including encoding, decoding, filtering, and/or formatting, and generate output signals. The output signals may include audio and/or video signals in standard and/or high definition formats. The output signals may be communicated to the network interface 785 and/or to the display 781. The display 781 may include a television, a projector, and/or a monitor.

The power supply 782 provides power to the components of the set top box 778. Memory 783 may include random access memory (RAM) and/or nonvolatile memory. Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 784 may include an optical storage drive, such as a DVD drive, and/or a hard disk drive (HDD).

Figure 9G:
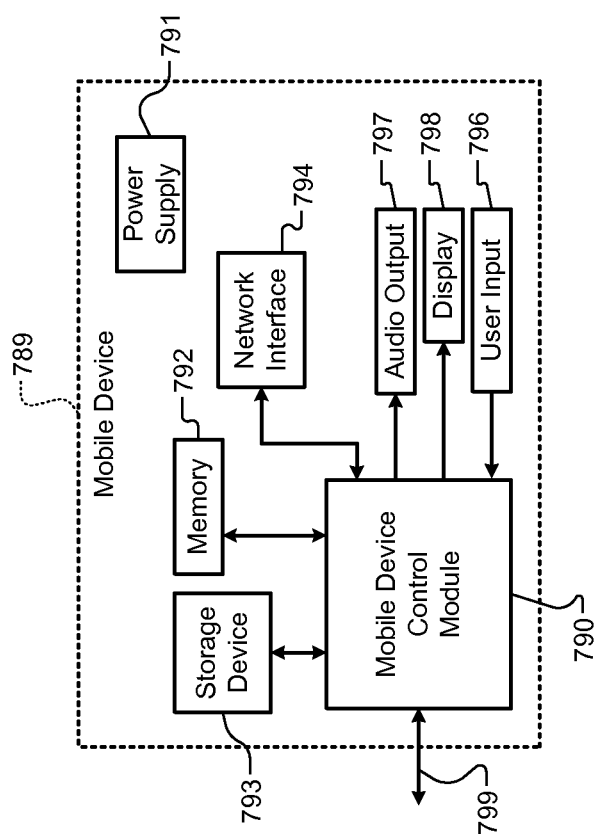
FIG. 9G is a functional block diagram of a mobile device.

Referring now to FIG. 9G, the teachings of the disclosure can be implemented in a memory 792 and/or a storage device 793 of a mobile device 789. The mobile device 789 may include a mobile device control module 790, a power supply 791, memory 792, the storage device 793, a network interface 794, and an external interface 799. If the network interface 794 includes a wireless local area network interface, an antenna (not shown) may be included.

The mobile device control module 790 may receive input signals from the network interface 794 and/or the external interface 799. The external interface 799 may include USB, infrared, and/or Ethernet. The input signals may include compressed audio and/or video, and may be compliant with the MP3 format. Additionally, the mobile device control module 790 may receive input from a user input 796 such as a keypad, touchpad, or individual buttons. The mobile device control module 790 may process input signals, including encoding, decoding, filtering, and/or formatting, and generate output signals.

The mobile device control module 790 may output audio signals to an audio output 797 and video signals to a display 798. The audio output 797 may include a speaker and/or an output jack. The display 798 may present a graphical user interface, which may include menus, icons, etc. The power supply 791 provides power to the components of the mobile device 789. Memory 792 may include random access memory (RAM) and/or nonvolatile memory.

Nonvolatile memory may include any suitable type of semiconductor or solid-state memory, such as flash memory (including NAND and NOR flash memory), phase-change memory, magnetic RAM, and multi-state memory, in which each memory cell has more than two states. The storage device 793 may include an optical storage drive, such as a DVD drive, and/or a hard disk drive (HDD). The mobile device may include a personal digital assistant, a media player, a laptop computer, a gaming console, or other mobile computing device.

Memory controllers and memory chips according to the principles of the present disclosure may be used in high-performance and enterprise computing systems. Enterprise computing systems may provide services, such as file serving, database processing, and application hosting, to multiple users throughout an organization. Enterprise computing systems may be characterized by high uptime (such as 99.99% uptime), scalability, and large amounts of memory. In these situations, the benefits of the memory systems of the present disclosure, which may include reducing memory chip cost, may be amplified.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A method of controlling a memory chip, the memory chip including a plurality of storage elements, the method comprising:
   receiving a plurality of target values from a memory controller, wherein each target value of the plurality of target values received from the memory controller corresponds to a respective one of the plurality of storage elements; and
   for each storage element of the plurality of storage elements, adjusting a measurable parameter of the storage element until the measurable parameter of the storage element reaches the target value corresponding to the storage element received from the memory controller.

2. The method of claim 1, wherein each target value of the plurality of target values corresponds to one or more of a current, a voltage, a resistance, or a threshold voltage.

3. The method of claim 1, wherein the adjusting the measurable parameter of the storage element comprises:
   programming the storage element;
   measuring the measurable parameter of the storage element;
   determining whether the measurable parameter of the storage element has reached the target value corresponding to the storage element received from the memory controller; and
   in response to the measurable parameter of the storage element not having reached the target value corresponding to the storage element received from the memory controller, iteratively repeating the programming, the measuring, and the determining.

4. The method of claim 3, wherein the determining includes:
   calculating a difference between the measurable parameter of the storage element and the target value corresponding to the storage element received from the memory controller; and
   determining that the measurable parameter of the storage element has reached the target value corresponding to the storage element received from the memory controller in response to the difference being less than a predetermined amount.

5. The method of claim 1, further comprising reading a first storage element of the plurality of storage elements by:
   measuring the measurable parameter of the first storage element; and
   transmitting the measurable parameter of the first storage element to the memory controller.

6. The method of claim 5, wherein the measurable parameter of each of the plurality of storage elements is a current, a voltage, a resistance, or a threshold voltage.

7. The method of claim 5, wherein the reading the first storage element of the plurality of storage elements further includes:
   measuring a second measurable parameter of the first storage element; and
   transmitting the second measurable parameter of the first storage element to the memory controller.

8. The method of claim 7, wherein:
   the measurable parameter of each of the plurality of storage elements is a current, a voltage, a resistance, or a threshold voltage; and
   the second measurable parameter of each of the plurality of storage elements is a different one of the current, the voltage, the resistance, or the threshold voltage.

9. The method of claim 5, wherein the measurable parameter of the first storage element is transmitted to the memory controller in analog form.

10. The method of claim 1, wherein the plurality of target values are received from the memory controller in analog form.

11. A memory chip comprising:
    a plurality of storage elements;
    a receiver configured to receive a plurality of target values from a memory controller, wherein each target value of the plurality of target values received from the memory controller corresponds to a respective one of the plurality of storage elements; and
    a programming module configured to, for each storage element of the plurality of storage elements, adjust a measurable parameter of the storage element until the measurable parameter of the storage element reaches the target value corresponding to the storage element received from the memory controller.

12. The memory chip of claim 11, wherein each target value of the plurality of target values corresponds to one or more of a current, a voltage, a resistance, or a threshold voltage.

13. The memory chip of claim 11, wherein the programming module is configured to adjust the measurable parameter of the storage element by:
    programming the storage element;
    measuring the measurable parameter of the storage element;
    determining whether the measurable parameter of the storage element has reached the target value corresponding to the storage element received from the memory controller; and
    in response to the measurable parameter of the storage element not having reached the target value corresponding to the storage element received from the memory controller, iteratively repeating the programming, the measuring, and the determining.

14. The memory chip of claim 13, wherein the programming module is configured to (i) calculate a difference between the measurable parameter of the storage element and the target value corresponding to the storage element received from the memory controller, and (ii) determine that the measurable parameter of the storage element has reached the target value corresponding to the storage element received from the memory controller in response to the difference being less than a predetermined amount.

15. The memory chip of claim 11, further comprising a read module configured to read a first storage element of the plurality of storage elements by:
    measuring the measurable parameter of the first storage element; and
    transmitting the measurable parameter of the first storage element to the memory controller.

16. The memory chip of claim 15, wherein the measurable parameter of each of the plurality of storage elements is a current, a voltage, a resistance, or a threshold voltage.

17. The memory chip of claim 15, wherein the read module is further configured to read the first storage element of the plurality of storage elements by:
- measuring a second measurable parameter of the first storage element; and
- transmitting the second measurable parameter of the first storage element to the memory controller.

18. The memory chip of claim 17, wherein:
- the measurable parameter of each of the plurality of storage elements is a current, a voltage, a resistance, or a threshold voltage; and
- the second measurable parameter of each of the plurality of storage elements is a different one of the current, the voltage, the resistance, or the threshold voltage.

19. The memory chip of claim 15, wherein the read module includes an analog line driver configured to transmit the measurable parameter of the first storage element to the memory controller in analog form.

20. The memory chip of claim 11, wherein the receiver includes an analog buffer configured to receive the plurality of target values from the memory controller in analog form.

21. A memory system comprising:
- the memory chip of claim 11; and
- the memory controller.

* * * * *